(12) United States Patent
Leow et al.

(10) Patent No.: US 8,900,923 B2
(45) Date of Patent: Dec. 2, 2014

(54) PACKAGED MICROELECTRONIC DEVICES AND METHODS FOR MANUFACTURING PACKAGED MICROELECTRONIC DEVICES

(71) Applicant: Micron Technology, Inc., Boise, ID (US)

(72) Inventors: See Hiong Leow, Singapore (SG); Liang Chee Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 13/845,686

(22) Filed: Mar. 18, 2013

(65) Prior Publication Data

US 2013/0217182 A1  Aug. 22, 2013

Related U.S. Application Data

(62) Division of application No. 12/792,576, filed on Jun. 2, 2010, now Pat. No. 8,399,971, which is a division of application No. 11/626,683, filed on Jan. 24, 2007, now Pat. No. 7,741,150.

(30) Foreign Application Priority Data

Dec. 4, 2006 (SG) .................................. 200608455

(51) Int. Cl.
| | |
|---|---|
| *H01L 21/58* | (2006.01) |
| *H01L 25/00* | (2006.01) |
| *H01L 21/56* | (2006.01) |
| *H01L 25/065* | (2006.01) |
| *H01L 21/683* | (2006.01) |
| *H01L 23/00* | (2006.01) |
| *H01L 23/31* | (2006.01) |

(52) U.S. Cl.
CPC ....... *H01L 24/85* (2013.01); *H01L 2225/06575* (2013.01); *H01L 25/50* (2013.01); *H01L 2224/29101* (2013.01); *H01L 21/561* (2013.01); *H01L 24/48* (2013.01); *H01L 2224/32245* (2013.01); *H01L 2924/014* (2013.01);
(Continued)

(58) Field of Classification Search
CPC .................................................. H01L 25/0657
USPC .................................................. 438/109, 118
See application file for complete search history.

(56) References Cited

U.S. PATENT DOCUMENTS

| | | |
|---|---|---|
| 5,128,831 A | 7/1992 | Fox, III et al. |
| 5,252,857 A | 10/1993 | Kane et al. |

(Continued)

OTHER PUBLICATIONS

Office Action issued Dec. 5, 2008 in U.S. Appl. No. 11/217,886.

(Continued)

*Primary Examiner* — George Fourson, III
(74) *Attorney, Agent, or Firm* — Perkins Coie LLP

(57) ABSTRACT

Packaged microelectronic devices and methods of manufacturing packaged microelectronic devices are disclosed herein. In one embodiment, a method of manufacturing a microelectronic device includes forming a stand-off layer over a plurality of microelectronic dies on a semiconductor workpiece, and removing selected portions of the stand-off layer to form a plurality of stand-offs with the individual stand-offs positioned on a backside of a corresponding die. The method further includes cutting the semiconductor workpiece to singulate the dies, and attaching the stand-off on a first singulated die to a second die.

8 Claims, 11 Drawing Sheets

(52) U.S. Cl.
CPC .................. *H01L 2224/2919* (2013.01); *H01L 2224/29007* (2013.01); *H01L 2924/15174* (2013.01); *H01L 2224/73265* (2013.01); *H01L 2224/48247* (2013.01); *H01L 2224/32225* (2013.01); H01L 25/0657 (2013.01); H01L 21/6835 (2013.01); *H01L 2924/14* (2013.01); H01L 24/32 (2013.01); *H01L 2924/01006* (2013.01); *H01L 2924/15311* (2013.01); *H01L 2924/01005* (2013.01); *H01L 2224/83136* (2013.01); *H01L 2924/07802* (2013.01); *H01L 2224/48227* (2013.01); H01L 24/27 (2013.01); *H01L 2224/48091* (2013.01); *H01L 2924/0665* (2013.01); *H01L 23/3107* (2013.01); *H01L 2924/15184* (2013.01); H01L 24/29 (2013.01); *H01L 2224/32145* (2013.01); *H01L 2924/01033* (2013.01); *H01L 2224/83101* (2013.01); *H01L 2224/8385* (2013.01); *H01L 2225/0651* (2013.01); *H01L 2224/85* (2013.01); H01L 24/83 (2013.01); *H01L 2924/01082* (2013.01)
USPC .......................................... 438/109; 438/118

(56) References Cited

U.S. PATENT DOCUMENTS

| | | | |
|---|---|---|---|
| 5,323,060 | A | 6/1994 | Fogal et al. |
| 5,518,957 | A | 5/1996 | Kim |
| 5,851,845 | A | 12/1998 | Wood et al. |
| 5,883,426 | A | 3/1999 | Tokuno et al. |
| 5,933,713 | A | 8/1999 | Farnworth |
| 5,946,553 | A | 8/1999 | Wood et al. |
| 5,986,209 | A | 11/1999 | Tandy |
| 5,990,566 | A | 11/1999 | Farnworth et al. |
| 6,004,867 | A | 12/1999 | Kim et al. |
| 6,005,778 | A | 12/1999 | Spielberger et al. |
| 6,008,070 | A | 12/1999 | Farnworth |
| 6,020,624 | A | 2/2000 | Wood et al. |
| 6,020,629 | A | 2/2000 | Farnworth et al. |
| 6,028,365 | A | 2/2000 | Akram et al. |
| 6,051,878 | A | 4/2000 | Akram et al. |
| 6,072,233 | A | 6/2000 | Corisis et al. |
| 6,072,236 | A | 6/2000 | Akram et al. |
| 6,124,634 | A | 9/2000 | Akram et al. |
| 6,175,149 | B1 | 1/2001 | Akram |
| 6,184,465 | B1 | 2/2001 | Corisis |
| 6,187,615 | B1 | 2/2001 | Kim et al. |
| 6,212,767 | B1 | 4/2001 | Tandy |
| 6,225,689 | B1 | 5/2001 | Moden et al. |
| 6,228,687 | B1 | 5/2001 | Akram et al. |
| 6,235,552 | B1 | 5/2001 | Kwon et al. |
| 6,235,554 | B1 | 5/2001 | Akram et al. |
| 6,258,623 | B1 | 7/2001 | Moden et al. |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |
| 6,326,697 | B1 | 12/2001 | Farnworth |
| 6,326,698 | B1 | 12/2001 | Akram |
| 6,326,700 | B1 | 12/2001 | Bai et al. |
| 6,407,381 | B1 | 6/2002 | Glenn et al. |
| 6,429,528 | B1 | 8/2002 | King et al. |
| 6,459,163 | B1 | 10/2002 | Bai et al. |
| 6,503,780 | B1 | 1/2003 | Glenn et al. |
| 6,531,784 | B1 | 3/2003 | Shim et al. |
| 6,538,317 | B1 | 3/2003 | Miyata |
| 6,548,376 | B2 | 4/2003 | Jiang |
| 6,552,910 | B1 | 4/2003 | Moon et al. |
| 6,560,117 | B2 | 5/2003 | Moon et al. |
| 6,576,531 | B2 | 6/2003 | Peng et al. |
| 6,607,937 | B1 | 8/2003 | Corisis |
| 6,703,075 | B1 | 3/2004 | Lin et al. |
| 6,753,613 | B2 | 6/2004 | Levardo et al. |
| 6,790,712 | B2 | 9/2004 | Bai et al. |
| 7,276,790 | B2 | 10/2007 | Seng |
| 8,198,713 | B2 * | 6/2012 | Hufgard ........................ 257/678 |
| 2002/0090753 | A1 | 7/2002 | Pai et al. |
| 2003/0022462 | A1 | 1/2003 | Farnworth et al. |
| 2003/0032217 | A1 | 2/2003 | Farnworth et al. |
| 2003/0038355 | A1 | 2/2003 | Derderian |
| 2003/0038357 | A1 | 2/2003 | Derderian |
| 2003/0111720 | A1 | 6/2003 | Tan et al. |
| 2003/0162324 | A1 | 8/2003 | Tomimatsu |
| 2003/0173679 | A1 | 9/2003 | Levardo et al. |
| 2004/0038447 | A1 | 2/2004 | Corisis et al. |
| 2004/0163240 | A1 | 8/2004 | Frezza |
| 2005/0023655 | A1 | 2/2005 | Fee et al. |
| 2005/0064681 | A1 | 3/2005 | Wood et al. |
| 2005/0112842 | A1 | 5/2005 | Kang et al. |
| 2005/0194674 | A1 | 9/2005 | Thomas et al. |
| 2005/0212109 | A1 | 9/2005 | Cherukuri et al. |
| 2006/0008739 | A1 | 1/2006 | Wood et al. |
| 2006/0022323 | A1 | 2/2006 | Swee Seng |
| 2006/0043509 | A1 | 3/2006 | Watkins et al. |
| 2006/0180907 | A1 | 8/2006 | James et al. |
| 2007/0045796 | A1 | 3/2007 | Ye et al. |
| 2007/0045807 | A1 | 3/2007 | Greenwood et al. |
| 2007/0178666 | A1 | 8/2007 | Do et al. |
| 2007/0289777 | A1 | 12/2007 | Pendse |
| 2008/0042245 | A1 | 2/2008 | Lee et al. |
| 2008/0054429 | A1 | 3/2008 | Bolken et al. |
| 2008/0128900 | A1 | 6/2008 | Leow et al. |
| 2008/0237824 | A1 | 10/2008 | St. Amand et al. |
| 2009/0014857 | A1 | 1/2009 | Hufgard |
| 2010/0237510 | A1 | 9/2010 | Leow et al. |

OTHER PUBLICATIONS

Office Action issued Jun. 9, 2008 in U.S. Appl. No. 11/217,886.
Search Report and Examination Report issued Dec. 11, 2008 in Singapore Application No. 200608455-2.
Search Report and Written Opinion issued Oct. 5, 2012 in Singapore Application No. 201002940-3, 18 pages.
Wolf et al., Silicon Processing for the VLSI Era; vol. 1—Process Technology, Lattice Press, 2000, p. 512.

* cited by examiner

PACKAGED MICROELECTRONIC DEVICES AND METHODS FOR MANUFACTURING PACKAGED MICROELECTRONIC DEVICES

CROSS-REFERENCE TO RELATED APPLICATIONS

This application is a divisional of U.S. application Ser. No. 12/792,576 filed Jun. 2, 2010, now U.S. Pat. No. 8,399,971, which is a divisional of U.S. application Ser. No. 11/626,683 filed Jan. 24, 2007, now U.S. Pat. No. 7,741,150, which claims foreign priority benefits of Singapore Application No. 200608455-2 filed Dec. 4, 2006, now Singapore Patent No. 143098, each of which is incorporated herein by reference.

TECHNICAL FIELD

The present disclosure is related to packaged microelectronic devices and methods for manufacturing packaged microelectronic devices.

BACKGROUND

Processors, memory devices, imagers and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond-pads coupled to the integrated circuit. The bond-pads provide external electrical contacts on the die through which supply voltage, signals, etc., are transmitted to and from the integrated circuit. The bond-pads are usually very small, and they are arranged in an array having a fine pitch between bond-pads. The dies can also be quite delicate. As a result, after fabrication, the dies are packaged to protect the dies and to connect the bond-pads to another array of larger terminals that is easier to connect to a printed circuit board.

Conventional processes for packaging dies include electrically coupling the bond-pads on the dies to an array of pins, ball-pads, or other types of electrical terminals, and then encapsulating the dies to protect them from environmental factors (e.g., moisture, particulates, static electricity, and physical impact). In one application, the bond-pads are electrically connected to contacts on an interposer substrate that has an array of ball-pads. For example, FIG. 1A schematically illustrates a conventional packaged microelectronic device 6 including a microelectronic die 10, an interposer substrate 60 attached to the die 10, a plurality of wire-bonds 90 electrically coupling the die 10 to the interposer substrate 60, and a casing 70 protecting the die 10 from environmental factors.

Electronic products require packaged microelectronic devices to have an extremely high density of components in a very limited space. For example, the space available for memory devices, imagers, processors, displays, and other microelectronic components is quite limited in cell phones, PDAs, portable computers, and many other products. As such, there is a strong drive to reduce the surface area or "footprint" of the microelectronic device 6 on a printed circuit board. Reducing the size of the microelectronic device 6 is difficult because high performance microelectronic dies 10 generally have more bond-pads, which result in larger ball-grid arrays and thus larger footprints. One technique used to increase the density of microelectronic dies 10 within a given footprint is to stack one microelectronic die on top of another.

FIG. 1B schematically illustrates another conventional packaged microelectronic device 6a having two stacked microelectronic dies 10a-b. The microelectronic device 6a includes a substrate 60a, a first microelectronic die 10a attached to the substrate 60a, a spacer 30 attached to the first die 10a with a first adhesive 22a, and a second microelectronic die 10b attached to the spacer 30 with a second adhesive 22b. The spacer 30 is a precut section of a semiconductor wafer. One drawback of the packaged microelectronic device 6a illustrated in FIG. 1B is that it is expensive to cut semiconductor wafers to form the spacer 30. Moreover, attaching the spacer 30 to the first and second microelectronic dies 10a-b requires additional equipment and steps in the packaging process.

To address these concerns, some conventional packaged microelectronic devices include an epoxy spacer, rather than a section of a semiconductor wafer, to space apart the first and second microelectronic dies 10a and 10b. The epoxy spacer is formed by dispensing a discrete volume of epoxy onto the first die 10a and then pressing the second die 10b downward into the epoxy. One drawback of this method is that it is difficult to position the second die 10b parallel to the first die 10a. As a result, microelectronic devices formed with this method often have "die tilt" in which the distance between the first and second dies varies across the device. If the second die 10b is not parallel to the first die 10a, but rather includes a "high side," the wire-bonds on the high side may be exposed after encapsulation. Moreover, the "low side" of the second die may contact the wire-bonds electrically connecting the first die to the substrate. This can cause an electrical short that renders the device defective. Accordingly, there is a need to improve the process of packaging multiple dies in a single microelectronic device.

BRIEF DESCRIPTION OF THE DRAWINGS

FIG. 2 is a schematic top plan view of a semiconductor workpiece.

FIG. 3 is a schematic side cross-sectional view of a portion of the workpiece of FIG. 2.

FIG. 4 is a schematic side cross-sectional view of the portion of the semiconductor workpiece after forming an adhesive layer on the stand-off layer.

FIG. 5 is a schematic side cross-sectional view of the portion of the semiconductor workpiece after removing sections of the stand-off and adhesive layers.

FIG. 6 is a schematic side cross-sectional view of the portion of the semiconductor workpiece after inverting the workpiece and reattaching the workpiece to the support member.

FIG. 7 is a schematic side cross-sectional view of a microelectronic device assembly including a lead frame, a microelectronic die attached to the lead frame, and a first singulated microelectronic device attached to the die.

FIG. 8 is a schematic side cross-sectional view of the microelectronic device assembly after attaching a second singulated microelectronic device to the first singulated microelectronic device.

FIG. 10 is a schematic side cross-sectional view of a portion of a workpiece including a stand-off structure and first and second adhesive layers formed on the stand-off structure.

FIG. 11 is a schematic side cross-sectional view of a packaged microelectronic device in accordance with another embodiment of the disclosure.

DETAILED DESCRIPTION

Specific details of several embodiments are described below with reference to packaged microelectronic devices including two or three stacked microelectronic dies, but in other embodiments the packaged microelectronic devices can have a different number of stacked dies and/or may include other components. For example, the microelectronic devices can include micromechanical components, data storage elements, optics, read/write components, or other features. The microelectronic dies can be SRAM, DRAM (e.g., DDR-SDRAM), flash-memory (e.g., NAND flash-memory), processors, imagers, and other types of devices. Moreover, several additional embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2-12.

Figure 1A:
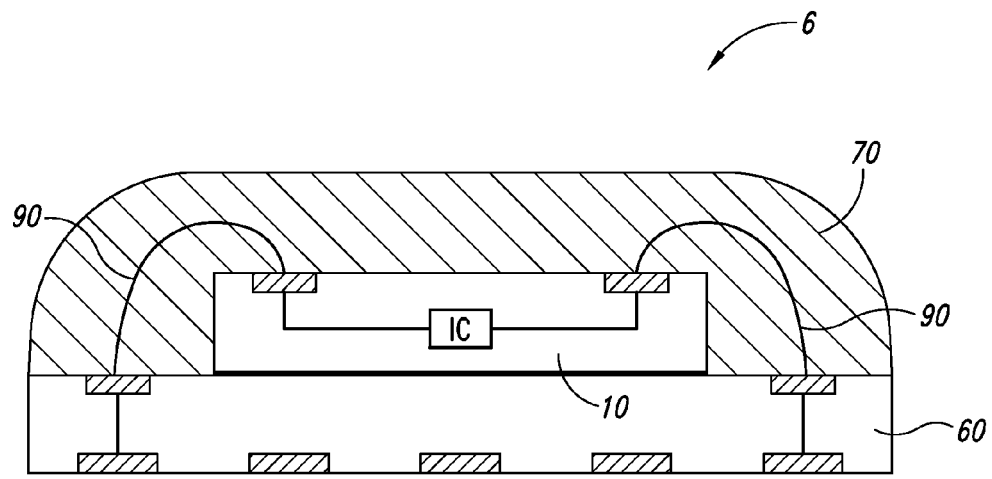
FIG. 1A schematically illustrates a conventional packaged microelectronic device in accordance with the prior art.
Figure 1B:
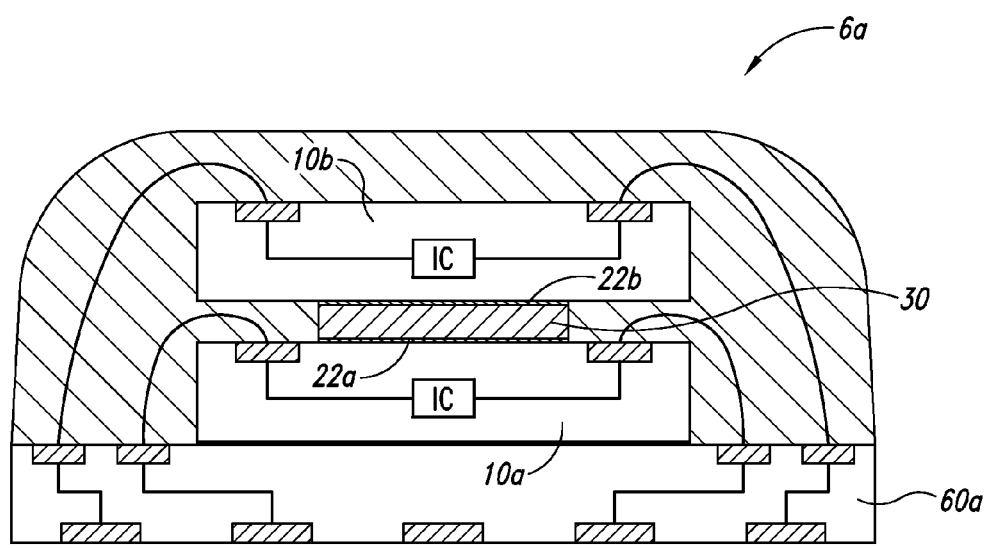
FIG. 1B schematically illustrates another conventional packaged microelectronic device in accordance with the prior art.
Figure 2:
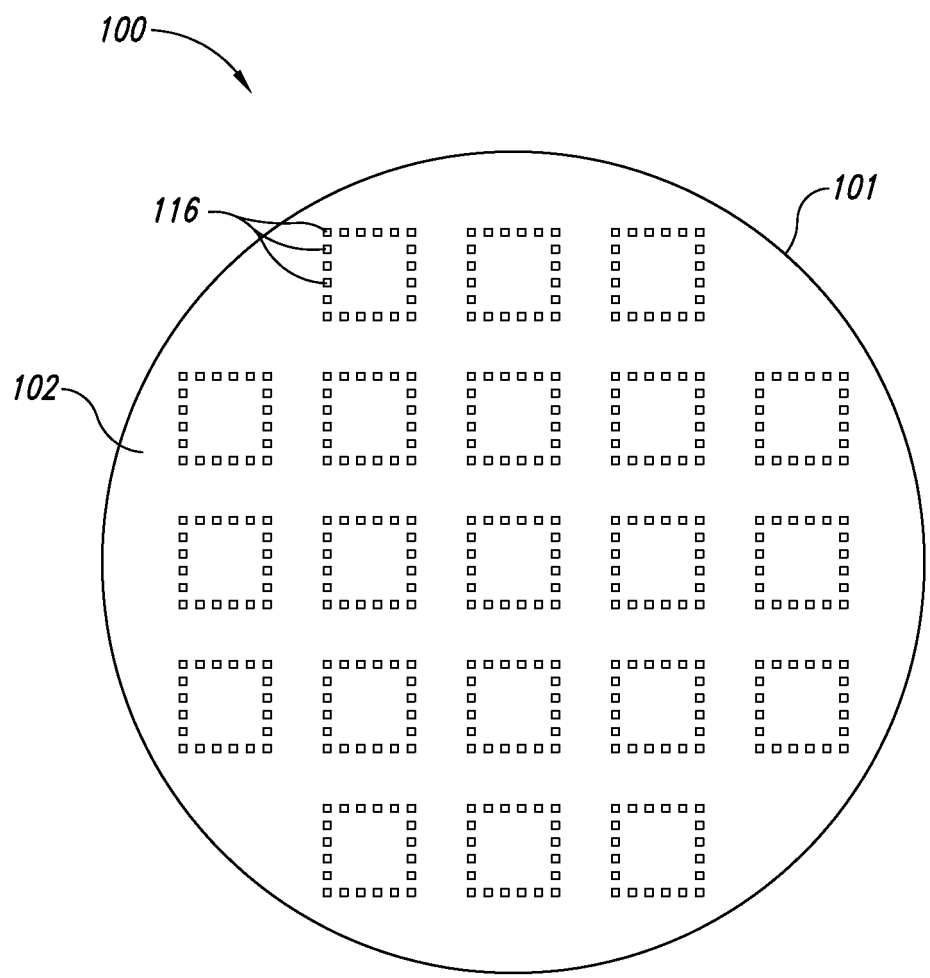
FIGS. 2-8 illustrate stages of a method of manufacturing a packaged microelectronic device in accordance with one embodiment of the disclosure.
Figure 3:
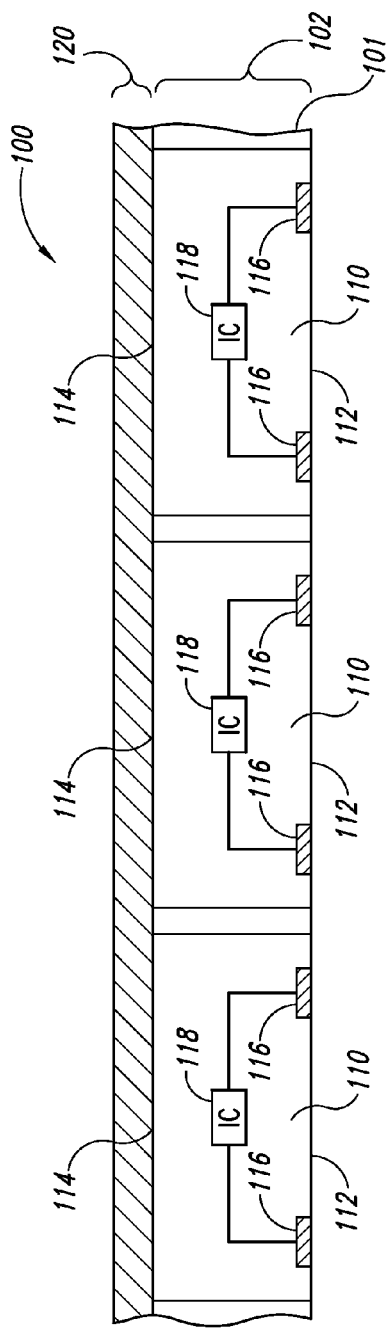

FIGS. 2-8 illustrate stages of a method of manufacturing a packaged microelectronic device in accordance with one embodiment of the disclosure. For example, FIG. 2 is a schematic top plan view of a semiconductor workpiece 100, and FIG. 3 is a schematic side cross-sectional view of a portion of the workpiece 100. The illustrated semiconductor workpiece 100 is a wafer 101 in and on which devices are constructed. Specifically, referring only to FIG. 3, the workpiece 100 includes a substrate 102 and a plurality of microelectronic dies 110 (only three are shown) formed in and/or on the substrate 102. The individual dies 110 include an active side 112, a backside 114 opposite the active side 112, a plurality of terminals 116 (e.g., bond-pads) arranged in an array on the active side 112, and an integrated circuit 118 (shown schematically) operably coupled to the terminals 116. Although the illustrated dies 110 have the same structure, in other embodiments the dies may have different features to perform different functions.

After constructing the microelectronic dies 110, a stand-off layer 120 is formed across the semiconductor workpiece 100 at the backsides 114 of the dies 110. The stand-off layer 120 can be formed on the workpiece 100 by molding, spin-on techniques, film lamination, screen printing, spraying, brushing, a dip bath, or other suitable processes. The stand-off layer 120 has a precise and generally uniform thickness and may be generally incompressible. For example, the stand-off layer 120 can be approximately 60 microns, but in other embodiments the stand-off layer 120 can have a thickness greater than or less than 60 microns. In several applications, the stand-off layer 120 can be made of a generally non-compressible material. The stand-off layer 120 may be composed of epoxy, epoxy acrylic, polyimide, or other suitable materials.

Figure 4:
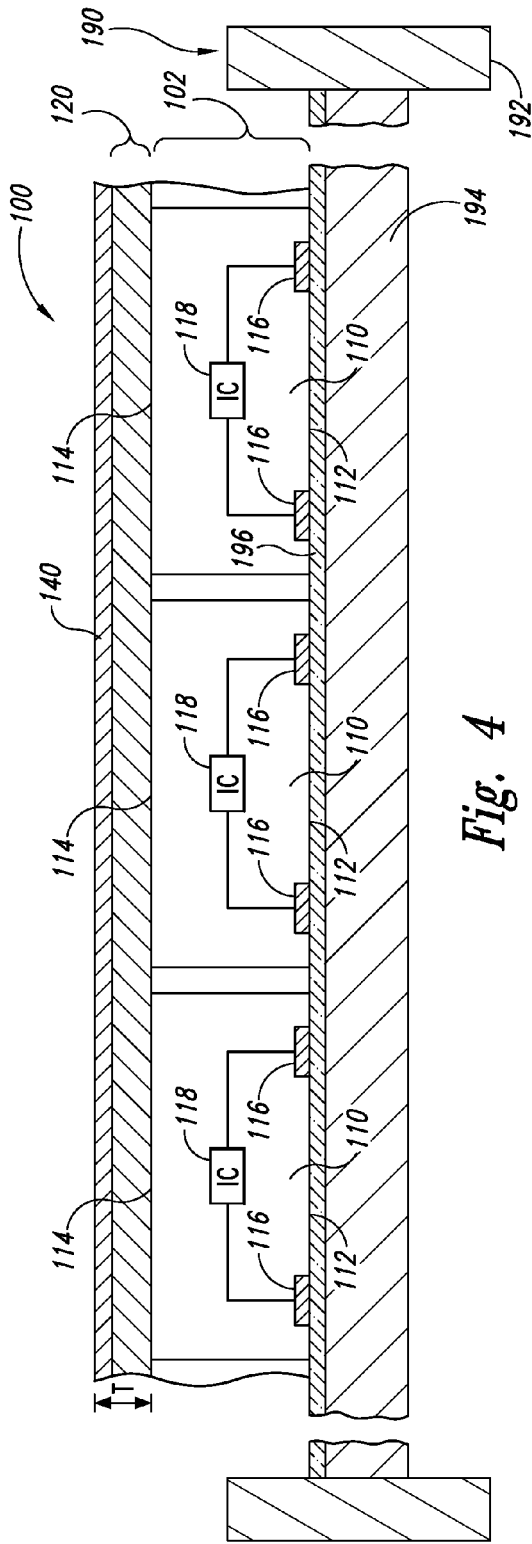

FIG. 4 is a schematic side cross-sectional view of the portion of the semiconductor workpiece 100 after forming an adhesive layer 140 on the stand-off layer 120. The adhesive layer 140 can be a die attach film or other suitable member for connecting the dies 110 to other dies as described below. The combination of the stand-off and adhesive layers 120 and 140 has a precise thickness T within the range of the desired distance between pairs of stacked microelectronic dies in a packaged microelectronic device as described in greater detail below. In other embodiments, the workpiece 100 may not include the adhesive layer 140. In either case, the semiconductor workpiece 100 can be removably attached to a support member 190 during several processing procedures to provide support to the workpiece 100. The support member 190 may include a dicing support having an annular frame 192 carrying a replaceable film 194 that can include an attachment device 196 (e.g., UV tape) for releasably adhering the support member 190 to the active side 112 of the dies 110.

Figure 5:
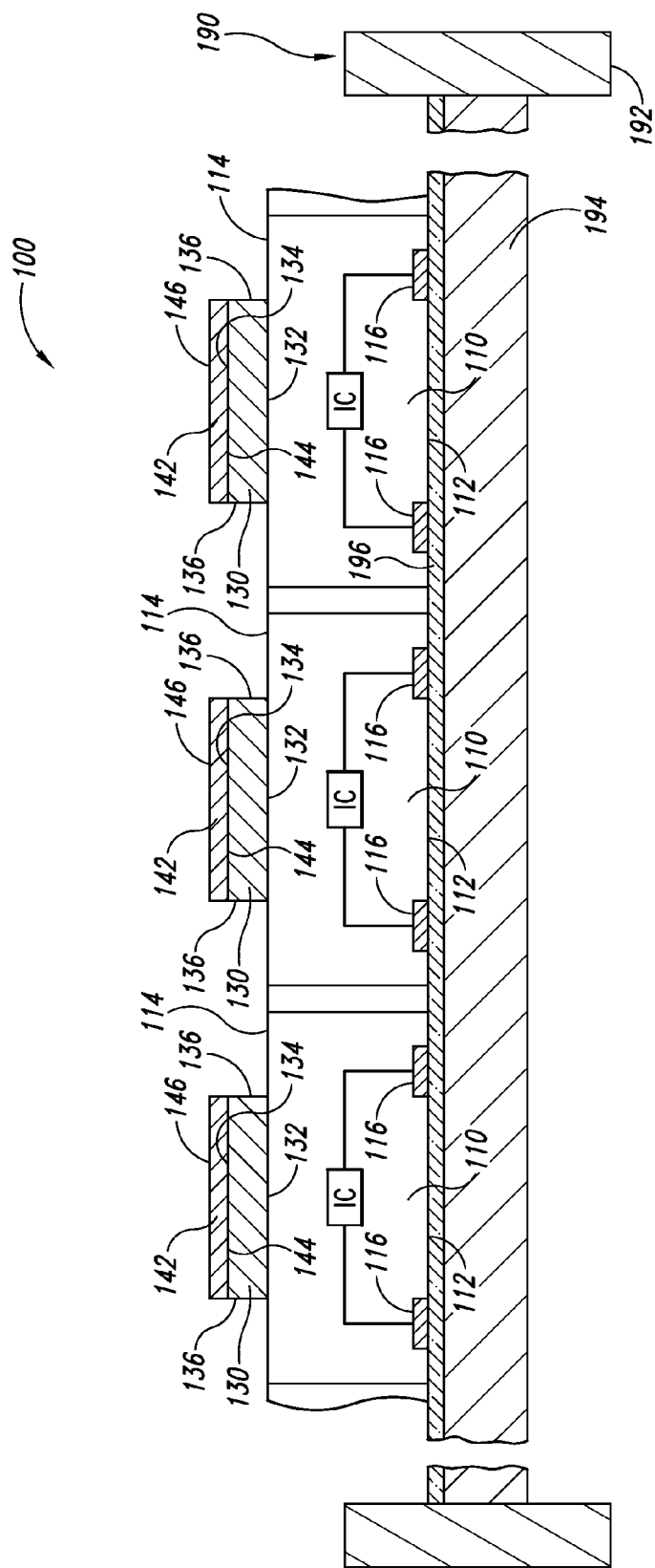

FIG. 5 is a schematic side cross-sectional view of the portion of the semiconductor workpiece 100 after removing sections of the stand-off and adhesive layers 120 and 140 to form a plurality of discrete stand-offs 130 with adhesive sections 142 on corresponding dies 110. Sections of the stand-off and adhesive layers 120 and 140 can be removed via etching, cutting (e.g., with a wafer saw or dicing blade), or other suitable methods. In other embodiments, the stand-off and/or adhesive layer 120 and/or 140 can be composed of a photoactive material, and sections of these layers 120 and/or 140 can be exposed and developed to form the stand-offs 130. In either case, the individual stand-offs 130 include a first surface 132 facing a corresponding die 110, a second surface 134 opposite the first surface 132, and a plurality of ends 136 extending between the first and second surfaces 132 and 134. The first surfaces 132 are attached to corresponding dies 110 without an adhesive because the stand-offs 130 themselves adhere to the dies 110. The second surfaces 134 are generally planar and oriented parallel to the backsides 114 of the dies 110. The ends 136 are spaced apart so that the illustrated stand-offs 130 are positioned inboard the terminals 116 (i.e., between the terminals 116 and the center of the particular die 110) and over the central portion of the corresponding dies 110. Although in the illustrated embodiment the stand-offs 130 have a rectangular cross-sectional shape and are positioned on the dies 110 in a one-to-one correspondence, in other embodiments the stand-offs can have other cross-sectional shapes and/or a plurality of stand-offs can be formed on each die 110. In either case, the position of the stand-offs 130 is driven by the configuration of the dies to which the particular stand-offs 130 are attached. The individual adhesive sections 142 include a first surface 144 facing the second surface 134 of the corresponding stand-off 130 and a second surface 146 opposite the first surface 144. The second surfaces 146 are generally planar and oriented parallel to the backsides 114 of the dies 110.

Figure 6:
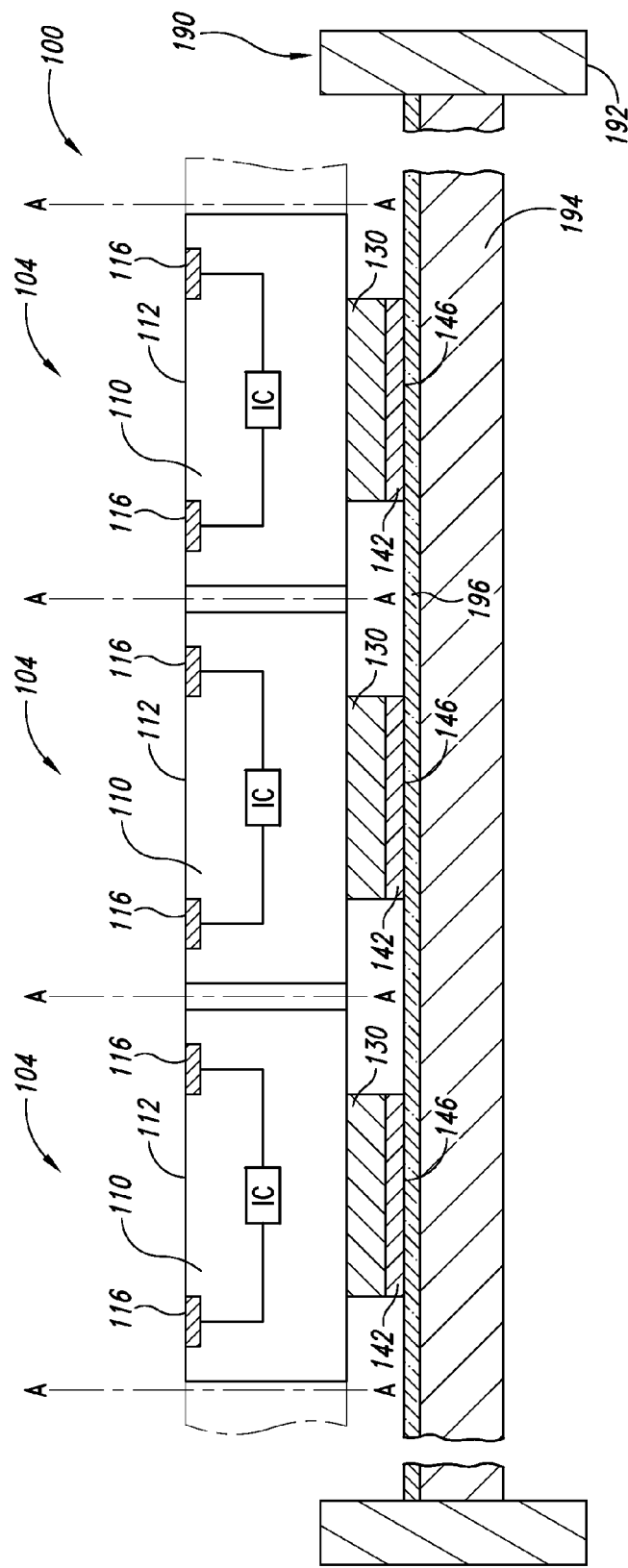

FIG. 6 is a schematic side cross-sectional view of the portion of the semiconductor workpiece 100 after inverting the workpiece 100 and reattaching the workpiece 100 to the support member 190 with the stand-offs 130 positioned between the dies 110 and the support member 190. Specifically, the workpiece 100 is removably attached to the support member 190 with the second surface 146 of the adhesive sections 142 contacting the attachment device 196 (e.g., UV tape). The workpiece 100 is then cut along lines A-A to singulate a plurality of microelectronic devices 104. The individual microelectronic devices 104 can be removed from the support member 190 via a conventional pick-and-place apparatus.

Figure 7:
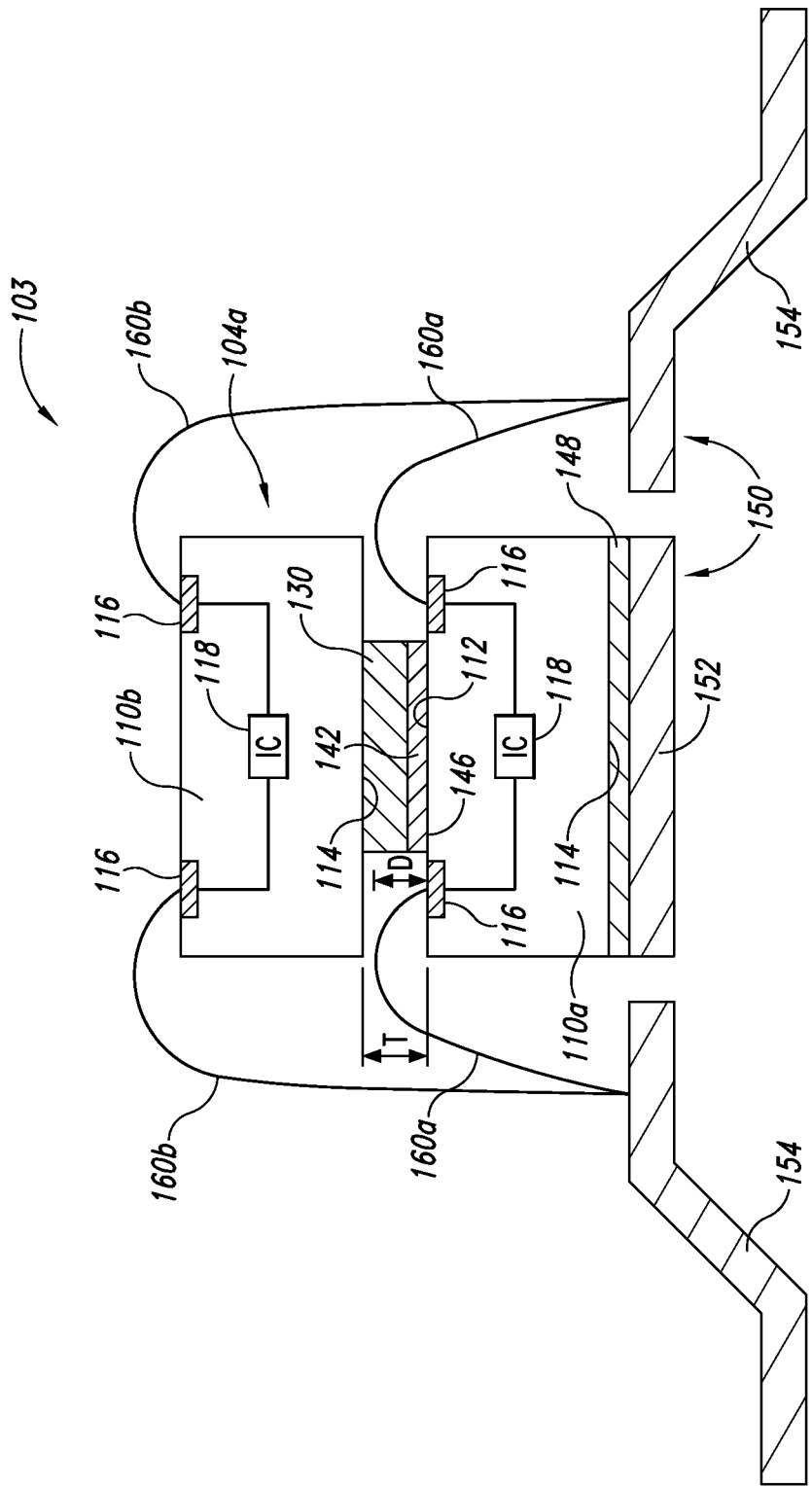

FIG. 7 is a schematic side cross-sectional view of a microelectronic device assembly 103 including a support member or lead frame 150, a microelectronic die 110a attached to the lead frame 150, and a first singulated microelectronic device 104a attached to the die 110a. For purposes of brevity and clarity, hereinafter the die 110a will be referred to as a first die 110a, and the die 110 of the first singulated microelectronic device 104a will be referred to as a second die 110b. The lead frame 150 includes (a) a die paddle 152 for carrying the first die 110a and the first singulated microelectronic device 104a, and (b) a plurality of leads 154 (only two are shown) for providing external electrical contacts. The first die 110a can be either generally similar to the second die 110b or have different features to perform different functions. For example, the illustrated first die 110a includes an active side 112, a backside 114 opposite the active side 112, a plurality of terminals 116 (e.g., bond-pads) arranged in an array on the active side 112, and an integrated circuit 118 (shown schematically) operably coupled to the terminals 116. The backside 114 of the first die 110a is attached to the die paddle 152 with an adhesive 148. After attaching the first die 110a to the die paddle 152, the terminals 116 can be electrically coupled to corresponding leads 154 with a plurality of first wire-bonds 160a.

After connecting the first die 110a to the lead frame 150, the first singulated microelectronic device 104a can be attached to the first die 110a with the stand-off 130 positioned between the first and second dies 110a and 110b. Specifically, the second surface 146 of the adhesive section 142 is placed against the active side 112 of the first die 110a such that the first microelectronic device 104a adheres to the first die 110a. In the illustrated embodiment, the stand-off 130 and adhesive section 142 are positioned inboard the terminals 116 of the first die 110a so as not to interfere with the first wire-bonds 160a. Moreover, the combined thickness T of the stand-off 130 and the adhesive section 142 is sized to space the first and second dies 110a-b apart by a sufficient distance so that the first wire-bonds 160a can electrically couple the first die 110a to the leads 154 without contacting the second die 110b. As such, the combined thickness T of the stand-off 130 and the adhesive section 142 is greater than a distance D that the first wire-bonds 160a project from the active surface 112 of the first die 110a. After attaching the first microelectronic device 104a to the first die 110a, the terminals 116 of the second die 110b are electrically coupled to corresponding leads 154 with a plurality of second wire-bonds 160b.

Figure 8:
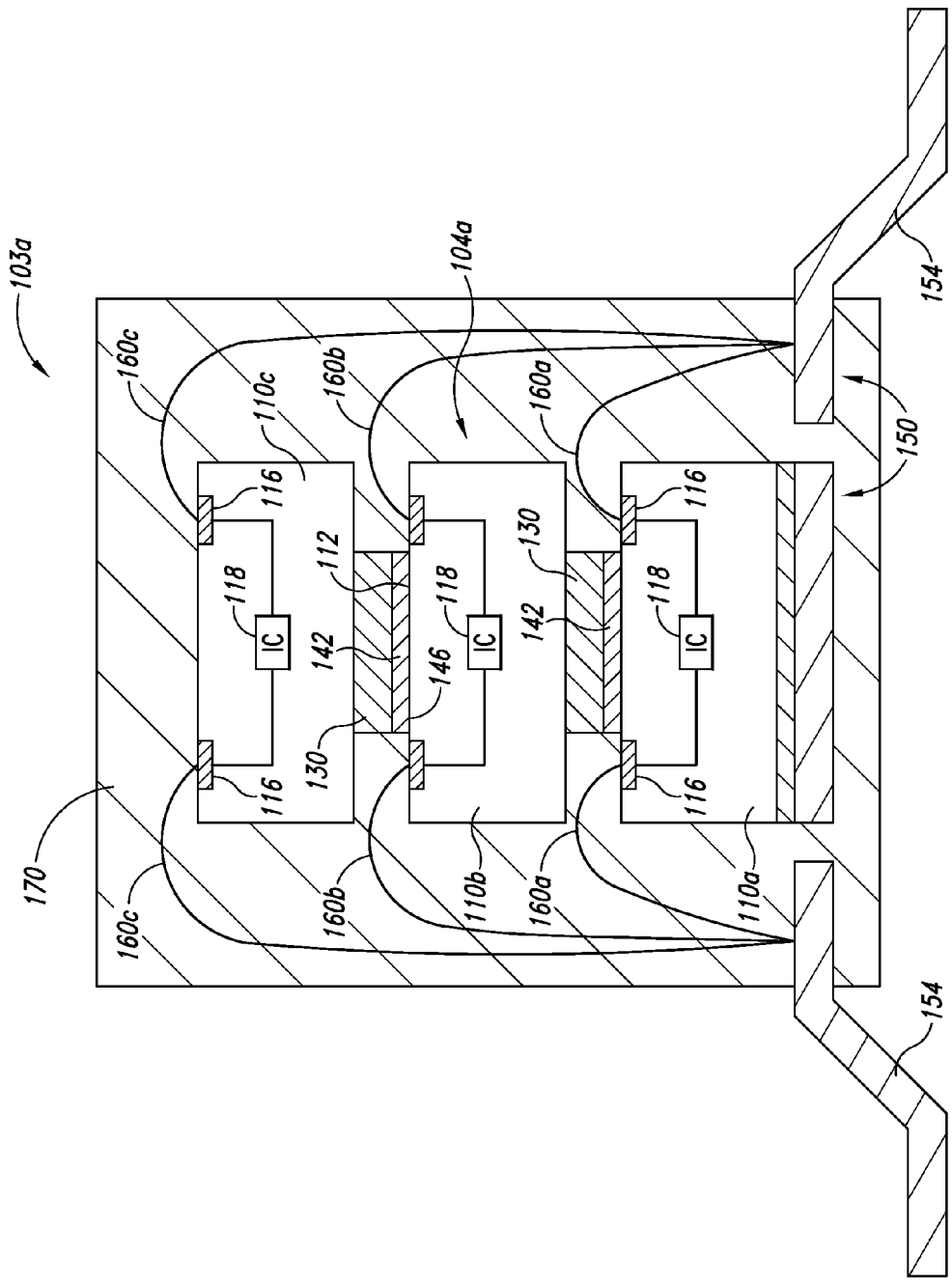

FIG. 8 is a schematic side cross-sectional view of the microelectronic device assembly 103 after attaching a second singulated microelectronic device 104b to the first singulated microelectronic device 104a. The second microelectronic device 104b can be attached to the first microelectronic device 104a in generally the same manner as the first microelectronic device 104a is attached to the first die 110a. After attachment, the second microelectronic device 104b is electrically connected to corresponding leads 154 with a plurality of third wire-bonds 160c. In other embodiments, such as the embodiment described below with reference to FIG. 9, the assembly 103 may not include the second microelectronic device 104b or the assembly 103 may include four or more microelectronic devices attached in a stacked configuration. In either case, a casing 170 is formed over the assembly 103 to encapsulate the first die 110a, the microelectronic devices 104, the wire-bonds 160, and a portion of the lead frame 150. The encased assembly 103 accordingly forms a packaged microelectronic device 103a.

Several embodiments of the method of manufacturing the packaged microelectronic device 103a illustrated in FIGS. 2-8 may enhance the quality and performance of the device 103a because the semiconductor fabrication processes can reliably produce and assemble the various components with a high degree of precision. For example, the stand-offs 130 and adhesive sections 142 can be formed with a precise, uniform thickness T so that the second and third microelectronic dies 110b-c are oriented generally parallel to the first microelectronic die 110a. As a result, the packaged microelectronic device 103a is expected to not have problems with die tilt and the concomitant exposure and/or shorting of wire-bonds. Moreover, the stand-offs 130 can be formed with relatively inexpensive materials, rather than expensive sections of a semiconductor wafer.

In one embodiment, a method of manufacturing a microelectronic device includes forming a stand-off layer over a plurality of microelectronic dies on a semiconductor workpiece, and removing selected portions of the stand-off layer to form a plurality of stand-offs. The individual stand-offs are positioned on a backside of a corresponding die. The method further includes cutting the semiconductor workpiece to singulate the dies, and attaching the stand-off on a first singulated die to a second die.

In another embodiment, a method includes forming a stand-off on a first microelectronic die, attaching a second microelectronic die to a support member, and coupling the stand-off to the second die. The stand-off is coupled to the second die after forming the stand-off on the first die and attaching the second die to the support member. The method further includes encapsulating the first and second dies and at least a portion of the support member.

In another embodiment, a method includes molding a stand-off structure, forming an adhesive layer on the stand-off structure, and cutting the stand-off structure to form a plurality of stand-offs. The method further includes attaching a first microelectronic die to a support member, coupling a first singulated stand-off to the first die, and connecting a second microelectronic die to the first singulated stand-off.

In another embodiment, a system comprises a microelectronic device including a support member and a first microelectronic die. The first die includes a backside attached to the support member, an active side opposite the backside, a plurality of terminals at the active side, and an integrated circuit operably coupled to the terminals. The device further includes a stand-off attached to the active side of the first die, and a second microelectronic die attached to the stand-off. The second die includes a backside, an active side opposite the backside, a plurality of terminals at the active side, and an integrated circuit operably coupled to the terminals. The backside of the second die is attached to the stand-off without an adhesive positioned between the stand-off and the backside of the second die.

In another embodiment, a semiconductor workpiece includes a substrate having a plurality of microelectronic dies. The individual dies include an active side, a backside opposite the active side, a plurality of terminals at the active side, and an integrated circuit operably coupled to the terminals. The workpiece further includes a plurality of stand-offs on the backsides of corresponding dies, and a plurality of adhesive sections attached to corresponding stand-offs.

In another embodiment, a microelectronic device includes a microelectronic die, a stand-off coupled to the die, and an exposed adhesive attached to the stand-off. The die includes an exposed active side, a backside opposite the active side, a plurality of terminals at the active side, and an integrated circuit operably coupled to the terminals. The stand-off is positioned at least partially inboard the terminals of the die and includes a first surface attached to the backside of the die and a second surface opposite the first surface. The exposed adhesive is placed on the second surface of the stand-off.

Figure 9:
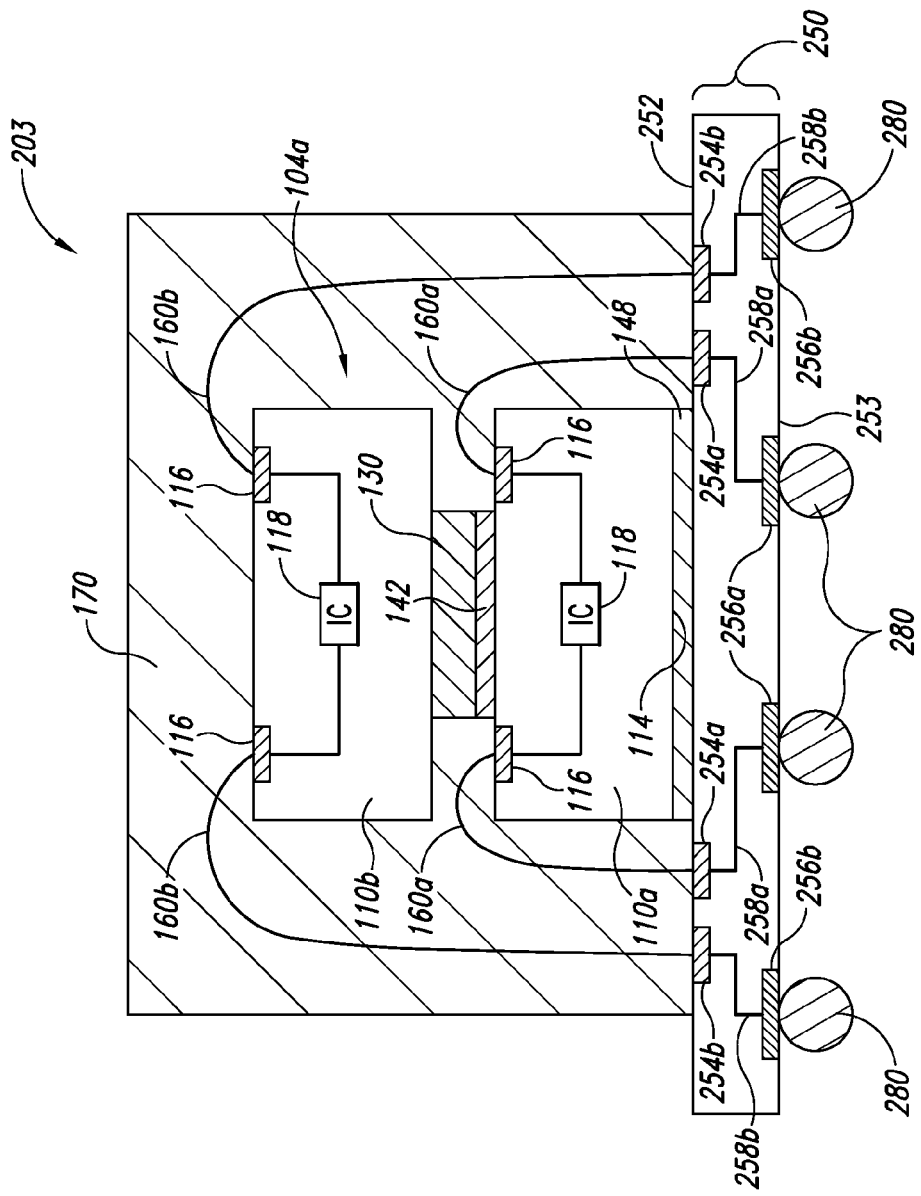
FIG. 9 is a schematic side cross-sectional view of a packaged microelectronic device in accordance with another embodiment of the disclosure.

FIG. 9 is a schematic side cross-sectional view of a packaged microelectronic device 203 in accordance with another embodiment of the disclosure. The packaged microelectronic device 203 is generally similar to the packaged microelectronic device 103a described above with reference to FIGS. 2-8. For example, the packaged microelectronic device 203 includes a first die 110a and a first microelectronic device 104a attached to the first die 110a. The illustrated packaged microelectronic device 203, however, does not include a second microelectronic device attached to the first microelectronic device 104a. Moreover, the support member of the illustrated packaged microelectronic device 203 includes an interposer substrate 250 in lieu of a lead frame. The interposer substrate 250 includes a first side 252 attached to the backside 114 of the first die 110a and a second side 253 opposite the first side 252. The first side 252 includes (a) a plurality of first contacts 254a arranged in arrays for attachment to corresponding first wire-bonds 160a, and (b) a plurality of second contacts 254 arranged in arrays for attachment to corresponding second wire-bonds 160b. The second side 253 includes (a) a plurality of first pads 256a electrically connected to corresponding first contacts 254a with a plurality of first conductive traces 258a, and (b) a plurality of second pads 256b electrically connected to corresponding second contacts 254b with a plurality of second conductive traces 258b. The illustrated packaged microelectronic device 203 further includes a plurality of electrical couplers 280 (e.g., solder balls) attached to the first and second pads 256a-b.

Figure 10:
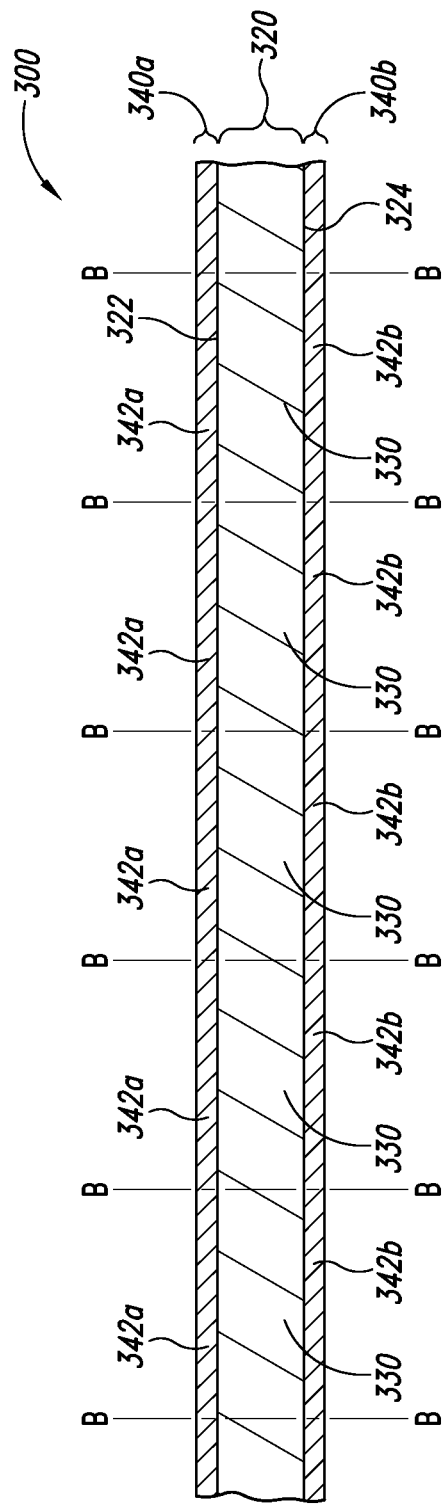
FIGS. 10 and 11 illustrate stages of a method of manufacturing a packaged microelectronic device in accordance with another embodiment of the disclosure.
Figure 11:
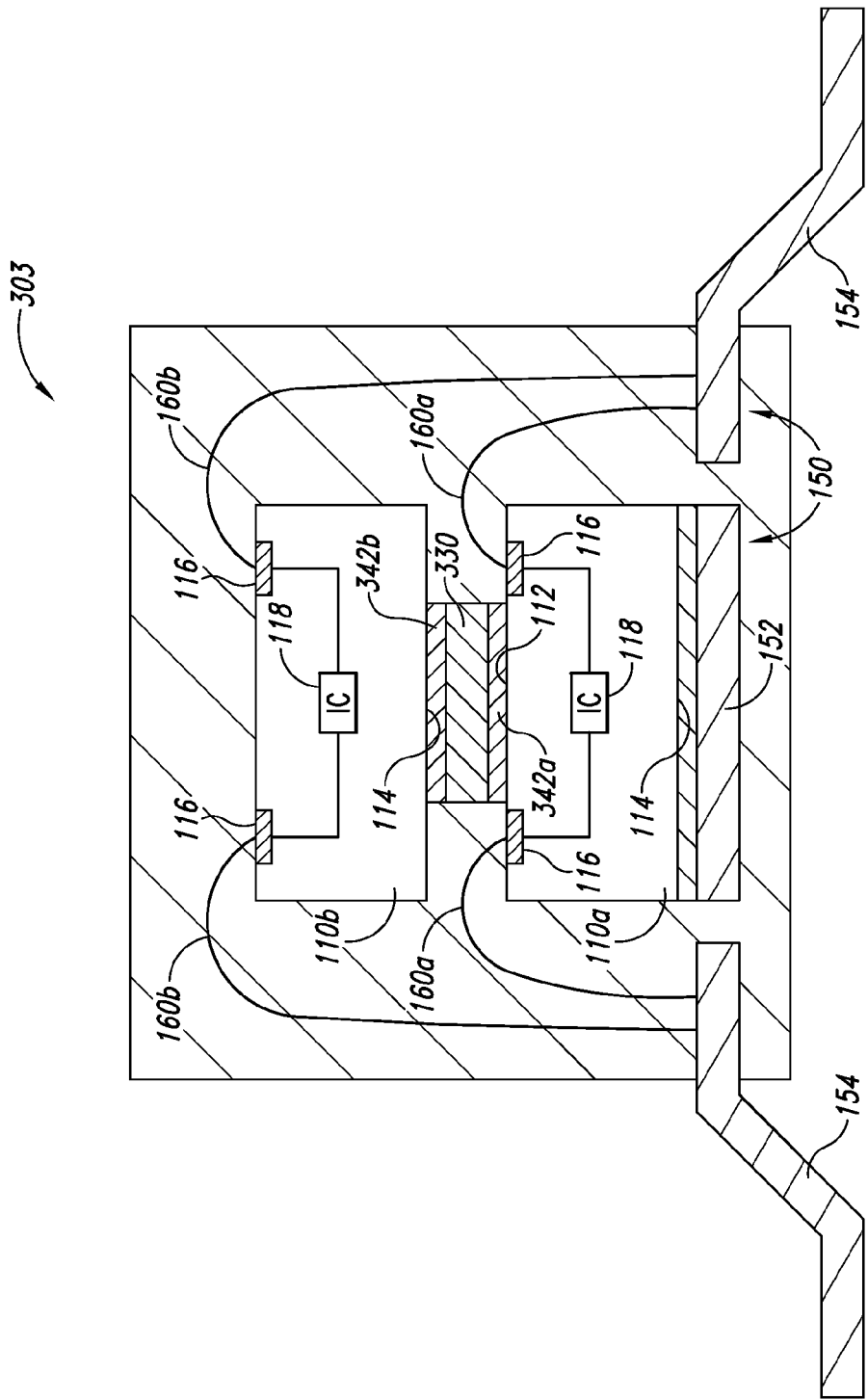

FIGS. 10 and 11 illustrate stages of a method of manufacturing a packaged microelectronic device in accordance with another embodiment of the disclosure. For example, FIG. 10 is a schematic side cross-sectional view of a portion of a workpiece 300 including a stand-off structure 320 and first and second adhesive layers 340a-b formed on the stand-off structure 320. The stand-off structure 320 has a circular, rectangular, or other suitable planform shape and includes a first major surface 322 and a second major surface 324 opposite the first major surface 322. The stand-off structure 320 includes a flowable dielectric material and can be formed via molding or other suitable methods. After forming the stand-off structure 320, the first adhesive layer 340a is placed on the first major surface 322 and the second adhesive layer 340b is placed on the second major surface 324. After attaching the adhesive layers 340, the workpiece 300 is cut along lines B-B to singulate a plurality of individual stand-offs 330 with corresponding adhesive sections 342a-b. In other embodiments, the workpiece 300 may not include one or both of the adhesive layers 340 such that one or both of the major surfaces 322 and 324 are exposed.

FIG. 11 is a schematic side cross-sectional view of a packaged microelectronic device 303 in accordance with another embodiment of the disclosure. The packaged microelectronic device 303 is generally similar to the packaged microelectronic device 103a described above with reference to FIGS. 2-8. For example, the packaged microelectronic device 303 includes a lead frame 150, a first die 110a attached to the lead frame 150, and a second die 110b attached to the first die 110a. The illustrated packaged microelectronic device 303, however, further includes a first singulated stand-off 330 positioned between the first and second dies 110a-b with the first adhesive section 342a attached to the active side 112 of the first die 110a and the second adhesive section 342b attached to the backside 114 of the second die 110b. In additional embodiments, the packaged microelectronic device 303 may include three or more microelectronic dies 110 attached in a stacked configuration. In other embodiments, the packaged microelectronic device 303 may include an interposer substrate in lieu of the lead frame 150.

Figure 12:
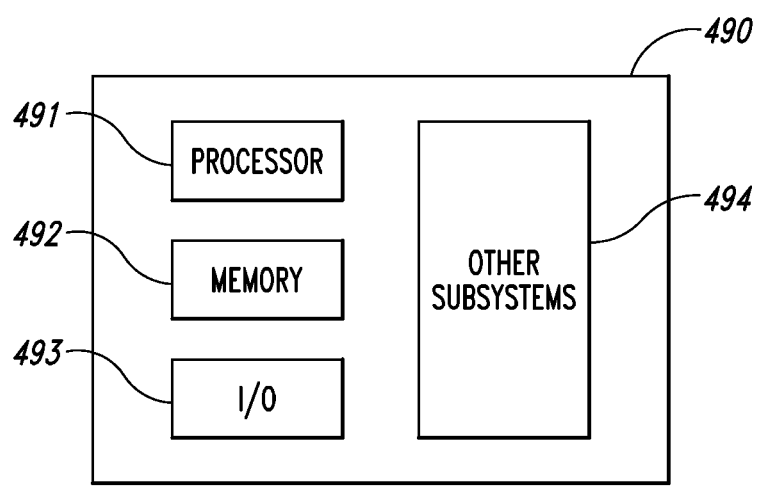
FIG. 12 is a schematic illustration of a system in which the microelectronic devices may be incorporated.

Any one of the packaged microelectronic devices described above with reference to FIGS. 2-11 can be incorporated into any of a myriad of larger and/or more complex systems 490, a representative one of which is shown schematically in FIG. 12. The system 490 can include a processor 491, a memory 492 (e.g., SRAM, DRAM, Flash, and/or other memory device), input/output devices 493, and/or other subsystems or components 494. Microelectronic devices may be included in any of the components shown in FIG. 12. The resulting system 490 can perform any of a wide variety of computing, processing, storage, sensor, imagers, and/or other functions. Accordingly, representative systems 490 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini computers. Other representative systems 490 include cameras, light or other radiation sensors, servers and associated server subsystems, display devices, and/or memory devices. In such systems, individual dies can include imager arrays, such as CMOS imagers. Components of the system 490 may be housed in a single unit or distributed over multiple, interconnected units, e.g., through a communications network. Components can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the invention. For example, many of the elements of one embodiment can be combined with other embodiments in addition to or in lieu of the elements of the other embodiments. Accordingly, the invention is not limited except as by the appended claims.

We claim:

1. A method of manufacturing a microelectronic device, the method comprising:
   molding a stand-off structure;
   forming an adhesive layer on the stand-off structure;
   cutting the stand-off structure to form a plurality of stand-offs;
   attaching a first microelectronic die to a support member;
   coupling a first singulated stand-off to the first die; and
   connecting a second microelectronic die to the first singulated stand-off.

2. The method of claim 1 wherein molding a stand-off structure comprises forming a stand-off structure having a first major surface and a second major surface opposite the first major surface, and wherein the first and second major surfaces are exposed.

3. The method of claim 1 wherein:
   the stand-off structure comprises a first major surface and a second major surface opposite the first major surface;
   forming the adhesive layer comprises disposing a first adhesive layer on the first major surface; and
   the method further comprises placing a second adhesive layer on the second major surface.

4. The method of claim 1 wherein:
attaching the first die to the support member comprises connecting a backside of the first die to the support member; and
coupling the first singulated stand-off to the first die comprises attaching the first singulated stand-off to an active side of the first die.

5. The method of claim 1 wherein:
coupling the first singulated stand-off to the first die comprises attaching the first singulated stand-off to the first die with the stand-off and corresponding section of the adhesive layer projecting a first distance in a first direction from the first die;
the method further comprises wire-bonding the first die to the support member with a plurality of wire-bonds; and
the individual wire-bonds project a second distance in the first direction from the first die, the second distance being less than the first distance.

6. The method of claim 1 wherein attaching the first die to the support member comprises coupling the first die to an interposer substrate.

7. The method of claim 1 wherein attaching the first die to the support member comprises coupling the first die to a lead frame.

8. The method of claim 1 wherein connecting the second die to the first singulated stand-off comprises attaching the second die to the first singulated stand-off after coupling the first singulated stand-off to the first die.

* * * * *